(12) United States Patent
Kai et al.

(10) Patent No.: US 10,398,036 B2
(45) Date of Patent: Aug. 27, 2019

(54) SEMICONDUCTOR DEVICE

(71) Applicant: FUJI ELECTRIC CO., LTD., Kawasaki-shi, Kanagawa (JP)

(72) Inventors: Kenshi Kai, Matsumoto (JP); Rikihiro Maruyama, Matsumoto (JP); Yoshihiro Miyazaki, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/885,057

(22) Filed: Jan. 31, 2018

(65) Prior Publication Data

US 2018/0279484 A1    Sep. 27, 2018

(30) Foreign Application Priority Data

Mar. 23, 2017    (JP) ................. 2017-056844

(51) Int. Cl.
| | |
|---|---|
| *H01L 23/48* | (2006.01) |
| *H05K 3/34* | (2006.01) |
| *H01L 23/498* | (2006.01) |
| *H01L 23/00* | (2006.01) |

(52) U.S. Cl.
CPC ...... *H05K 3/3415* (2013.01); *H01L 23/49811* (2013.01); *H01L 24/48* (2013.01); *H01L 2224/4814* (2013.01); *H05K 2201/10916* (2013.01)

(58) Field of Classification Search
CPC ....... H01L 2224/97; H01L 2224/73265; H01L 2224/48247; H01L 2224/83; H01L 2224/32145; H01L 2224/48227; H01L 24/32; H01L 2224/0401; H01L 24/13; H01L 24/29; H01L 23/48; H01L 2224/12105; H01L 24/81; H01L 2224/83192; H01L 24/48; H01L 2224/48245
USPC ....................................... 257/734
See application file for complete search history.

(56) References Cited

U.S. PATENT DOCUMENTS

2009/0194884 A1    8/2009    Stolze
2015/0340333 A1*   11/2015   Isozaki ............ H01L 23/49811
                                                        257/737

FOREIGN PATENT DOCUMENTS

WO    WO-2014/148319 A1    9/2014

* cited by examiner

*Primary Examiner* — Theresa T Doan
(74) *Attorney, Agent, or Firm* — Rabin & Berdo, P.C.

(57) ABSTRACT

After a contact component is disposed in a concave joint space, when a solder solidifies, the solder thickness of the solder in the joint space is kept. Thus, a contact area between the contact component and the solder is kept, and the solder thickness of the solder that joins the contact component and a conductive pattern is kept. In addition, since an appropriate amount of the solder is kept in the joint space, an extra amount of solder does not need to be applied in advance. As a result, there is prevented creeping up of the solder into a hollow hole of the contact component, caused by the heat applied when the contact component is joined to the conductive pattern.

15 Claims, 11 Drawing Sheets

SEMICONDUCTOR DEVICE

CROSS-REFERENCE TO RELATED APPLICATION

This application is based upon and claims the benefit of priority of the prior Japanese Patent Application No. 2017-056844, filed on Mar. 23, 2017, the entire contents of which are incorporated herein by reference.

BACKGROUND OF THE INVENTION

1. Field of the Invention

The embodiments discussed herein are related to a semiconductor device.

2. Background of the Related Art

A semiconductor device includes semiconductor elements such as insulated gate bipolar transistors (IGBTs) or power metal oxide semiconductor field effect transistors (power MOSFETs). Such a semiconductor device is used as, for example, a power conversion apparatus.

The semiconductor device includes a substrate having an insulation plate and conductive patterns formed on the front surface of the insulation plate. On the conductive patterns, semiconductor elements and external connection terminals are disposed. Signals applied to the external connection terminals are inputted to the semiconductor elements through the conductive patterns.

When the external connection terminals are attached to the conductive patterns, cylindrical contact components are used. The contact components are joined to the conductive patterns via solder, and the external connection terminals are press-fitted into the contact components. Thus, the external connection terminals are electrically connected to the conductive patterns through the contact components.

See, for example, International Publication Pamphlet No. WO2014/148319.

However, when the amount of the solder (solder thickness) that joins the conductive patterns of the substrate and the contact components is small, joining strength of the contact components to the conductive patterns is reduced. If the joining strength of the contact components to the conductive patterns is reduced, the reduced joining strength may cause reduction in reliability of the semiconductor device. When the amount of the solder is large, the heat applied when the contact components are joined to the conductive patterns causes creeping up of the solder into hollow holes of the contact components. If the creeping up of the solder into the hollow holes occurs, the external connection terminals fail to be press-fitted into the contact component, possibly causing reduction in reliability of the semiconductor device. In addition to this, the solder spreads over and wets a non-target area on the substrate. As a result, the solder may wrap around another component, possibly causing reduction in reliability of the semiconductor device.

SUMMARY OF THE INVENTION

According to one aspect of the embodiments, there is provided a semiconductor device. The semiconductor device includes: a substrate including an insulation plate and a conductive pattern formed on the insulation plate, the conductive pattern having a concave joint space formed therein; and a contact component having a cylindrical shape with a hollow hole extending through the contact component, wherein the contact component includes a first open end portion on one side, the first open end portion being joined to the joint space of the conductive pattern via a joining member.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, some embodiments will be described with reference to the accompanying drawings.

First Embodiment

A semiconductor device of a first embodiment will be described with reference to FIG. 1.

Figure 1:
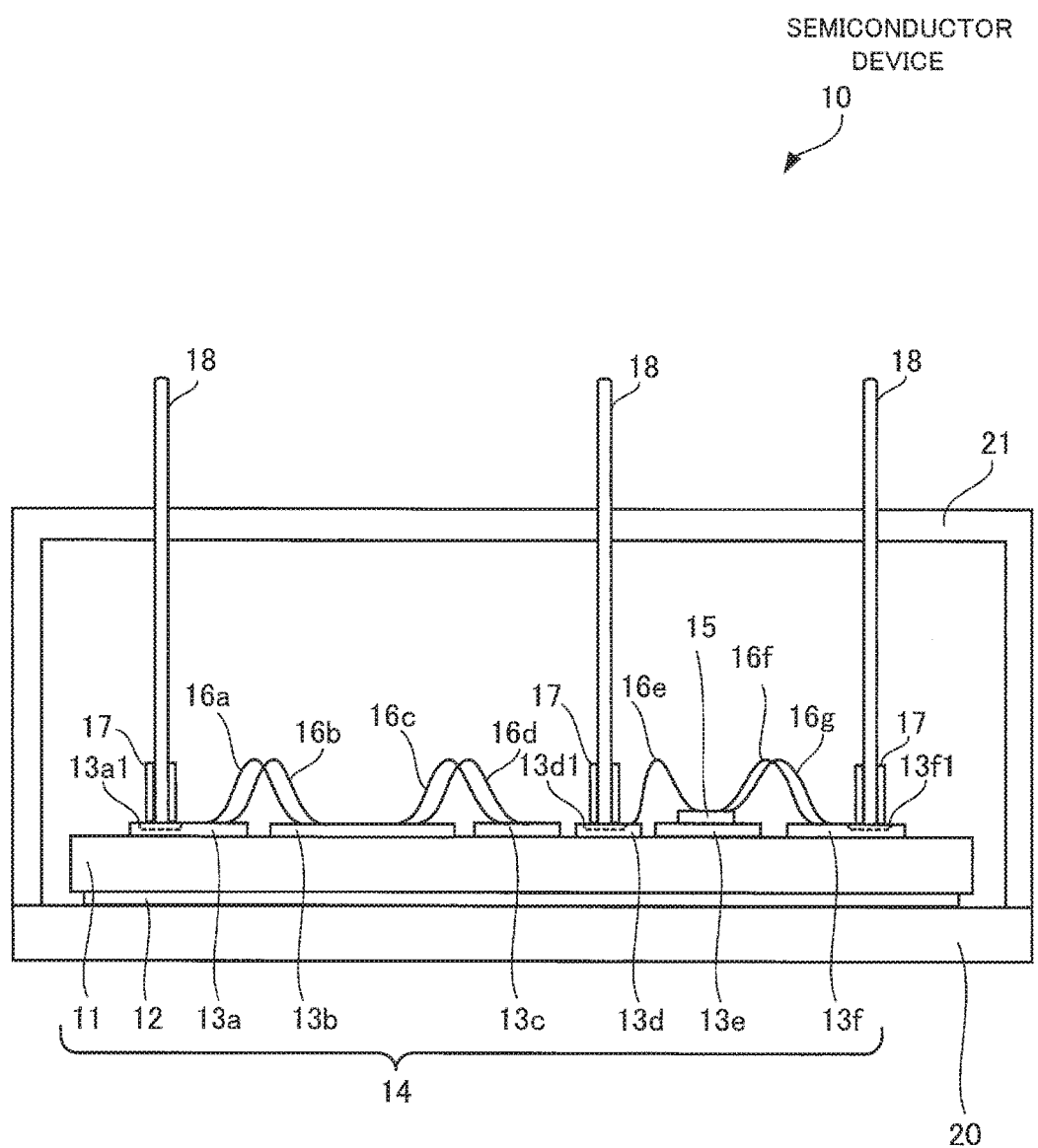
FIG. 1 is a side cross-sectional view of a semiconductor device of a first embodiment.

FIG. 1 is a side cross-sectional view of the semiconductor device of the first embodiment.

As illustrated in FIG. 1, a semiconductor device 10 includes a substrate 14, semiconductor elements 15 and contact components 17 disposed on the front surface of the substrate 14, and external connection terminals 18 attached to the corresponding contact components 17. Here, although the plurality of semiconductor elements 15 are disposed on the substrate 14, FIG. 1 illustrates one of the semiconductor elements 15. On the back surface of the substrate 14, a heat radiating plate 20 is disposed. Components including the substrate 14, semiconductor elements 15, and external connection terminals 18 are housed by the heat radiating plate 20 and a case 21. However, leading ends of the external connection terminals 18 extend from the case 21. Here, the front surface refers to a surface, on the side of which the leading ends of the external connection terminals 18 extend from the case 21 in the semiconductor device 10. The back surface refers to a surface, on the side of which the heat radiating plate 20 is disposed in the semiconductor device 10.

Hereinafter, in a case where below-described conductive patterns 13a, 13b, 13c, 13d, 13e, and 13f are not distinguished from each other, they are represented as conductive patterns 13. Similarly, in a case where below-described bonding wires 16a, 16b, 16c, 16d, 16e, 16f, and 16g are not distinguished from each other, they are represented as bonding wires 16.

The substrate 14 includes an insulation plate 11, a metal plate 12 formed on the back surface of the insulation plate 11, and the conductive patterns 13 formed on the front surface of the insulation plate 11. The insulation plate 11 is made of ceramic having a high thermal conductivity, such as aluminum oxide, aluminum nitride, or silicon nitride. The metal plate 12 is made of metal having a high thermal conductivity, such as aluminum, iron, silver, copper, or an alloy containing at least one of them. The conductive patterns 13 are made of metal having a high electrical conductivity, such as copper or a copper alloy. The substrate 14 having such a configuration is achieved by using, for example, a direct copper bonding (DCB) substrate or an active metal brazed (AMB) substrate. The substrate 14 conducts heat produced from the semiconductor elements 15, to the heat radiating plate 20 through the conductive patterns 13a, 13b, 13c, 13d, 13e, and 13f, the insulation plate 11, and the metal plate 12.

Some of the conductive patterns, 13a, 13d, and 13f, are provided with concave joint spaces 13a1, 13d1, and 13f1, in which the contact components 17 are disposed. Here, although the plurality of conductive patterns 13 are formed on the insulation plate 11, FIG. 1 illustrates the conductive patterns 13a, 13b, 13c, 13d, 13e, and 13f of the plurality of conductive patterns 13.

A cross-sectional shape of the concave joint spaces 13a1, 13d1, and 13f1 of the conductive patterns 13a, 13d, and 13f includes a bottom portion and an inner wall portion. The bottom portion is formed perpendicular to a stacking direction of the substrate 14. The inner wall portion is formed extending from the outer periphery of the bottom portion to the front surface of the conductive patterns 13a, 13d, and 13f. The inner wall portion may be perpendicular to the bottom portion, or may be obtuse or acute to the bottom portion. Preferably, the shape of the concave joint spaces 13a1, 13d1, and 13f1 in a plan view is a circle or a polygon such as a quadrilateral. For example, the concave joint spaces 13a1, 13d1, and 13f1 may be formed like a cylinder or a bowl. In addition, the concave joint spaces 13a1, 13d1, and 13f1 of the conductive patterns 13a, 13d, and 13f may have a convex portion (protruding portion) formed on their bottom portions. The cross-sectional shape of the convex portion (protruding portion) may be perpendicular to the bottom portion of each of the concave joint spaces 13a1, 13d1, and 13f1, or may be obtuse or acute to the bottom portion. Preferably, the shape of the convex portion (protruding portion) in a plan view is a circle or a polygon such as a quadrilateral. For example, the convex portion may be formed like a hemisphere, a cone, or a quadrangular pyramid. Furthermore, the concave joint spaces 13a1, 13d1, and 13f1 having different shapes may be variously combined with convex portions (protruding portions) having different shapes. For example, in a case where the shape of inner wall portions of the concave joint spaces 13a1, 13d1, and 13f1 is a circle and the shape of the convex portions (protruding portions) is also a circle, a doughnut-shaped concave portion is formed. With the joint spaces 13a1, 13d1, and 13f1 formed in this manner, there is obtained sufficient joining strength between the conductive patterns 13a, 13d, and 13f and the cylindrical contact components 17. Some detailed shapes of the joint spaces 13a1, 13d1, and 13f1 will be described later.

Examples of the semiconductor elements 15 include a switching device such as an IGBT or a power MOSFET. For example, such semiconductor elements 15 each include a drain electrode (or a collector electrode) formed on the back surface thereof as a main electrode, and a gate electrode and a source electrode (or an emitter electrode) formed on the front surface thereof as main electrodes.

Also, examples of the semiconductor elements 15 include, as needed, a diode such as a Schottky barrier diode (SBD) or a freewheeling diode (FWD). Such semiconductor elements 15 each include a cathode electrode formed on the back surface thereof as a main electrode, and an anode electrode formed on the front surface thereof as a main electrode. The back surfaces of the above-described semiconductor elements 15 are joined to the predetermined conductive patterns 13 via solder (not illustrated).

The contact components 17 each have a cylindrical shape in which a hollow hole is formed. The hollow hole passes through a portion between open end portions of each of the contact components 17. A portion of each of the contact components 17 on one open end portion side is joined to a corresponding one of the conductive patterns 13 via a joining member, and each of the external connection terminals 18 is press-fitted into a corresponding one of the contact components 17 from the other open end portion thereof. Each of the contact components 17 may include a body portion in which the hollow hole is formed, and a flange formed at least at one of the open end portions of the body portion. The contact components 17 are joined to the conductive patterns 13 by using solder. Here, although the contact components 17 are disposed on the plurality of conductive patterns 13 on the substrate 14, FIG. 1 illustrates some of the contact components 17 disposed on the conductive patterns 13a, 13d, and 13f. The contact components 17 are made of aluminum, iron, silver, copper, which have an excellent conductivity, or an alloy containing at least one of them. To improve corrosion resistance, a metal layer made of, for example, nickel or gold may be formed on the surfaces of the contact components 17 by plating or the like. Examples of the metal, other than nickel and gold, include nickel-phosphorus alloy and nickel-boron alloy. In addition, a gold layer may be formed on a nickel-phosphorus alloy layer. The contact components 17 will be described in detail later.

The external connection terminals 18 are made of aluminum, iron, silver, copper, which have an excellent conductivity, or an alloy containing at least one of them. The external connection terminals 18 are formed like a bar, and have a cross section whose shape is, for example, a square. The external connection terminals 18 are press-fitted into the hollow holes of the contact components 17, and thus are electrically connected to the conductive patterns 13 through the contact components 17.

On the substrate 14, the conductive patterns 13 are electrically connected to each other via bonding wires 16. For example, the conductive patterns 13a and 13b are electrically connected to each other via bonding wires 16a and 16*b*, and the conductive patterns 13*b* and 13*c* are electrically connected to each other via bonding wires 16*c* and 16*d*. Also on the substrate 14, some of the conductive patterns 13 and the semiconductor element 15 are electrically connected to each other via the bonding wires 16. For example, the conductive pattern 13*d* and the semiconductor element 15 are electrically connected to each other via a bonding wire 16*e*. Also, the conductive pattern 13*f* and the semiconductor element 15 are electrically connected to each other via bonding wires 16*f* and 16*g*. Thus, in the semiconductor device 10, the bonding wires 16 connect the conductive patterns 13 with each other, and connect some of the conductive patterns 13 and the semiconductor elements 15; the external connection terminals 18 are electrically connected to the conductive patterns 13; and thus a predetermined circuit including the semiconductor element 15 is formed.

The heat radiating plate 20 is made of, for example, aluminum, iron, silver, copper, which have a high thermal conductivity, or an alloy containing at least one of them. To improve corrosion resistance, a layer made of, for example, nickel may be formed on the surface of the heat radiating plate 20 by plating or the like. Examples of the material of the layer, other than nickel, include nickel-phosphorus alloy and nickel-boron alloy.

To improve heat radiation performance, a cooler (not illustrated) may be attached to the back surface of the heat radiating plate 20 via solder or silver solder. The cooler in this case is made of aluminum, iron, silver, copper, which have a high thermal conductivity, or an alloy containing at least one of them. In addition, fins, a heatsink constituted by a plurality of fins, or a water-cooled cooling apparatus may be used as the cooler. The heat radiating plate 20 may be formed integrally with such a cooler. In this case, the heat radiating plate 20 and the cooler are made of aluminum, iron, silver, copper, which have a high thermal conductivity, or an alloy containing at least one of them. To improve corrosion resistance, a layer made of, for example, nickel may be formed on the surface of the heat radiating plate 20, which is formed integrally with the cooler, by plating or the like. Examples of the material of the layer, other than nickel, include nickel-phosphorus alloy and nickel-boron alloy.

The case 21 may be box-shaped, and made of a thermoplastic resin. Examples of the thermoplastic resin include polyphenylene sulfide (PPS), polybutylene terephthalate (PBT) resin, polybutylene succinate (PBS) resin, polyamide (PA) resin, and acrylonitrile butadiene styrene (ABS) resin.

The interior of the case 21 may be sealed with a sealing member (not illustrated). The sealing member is made of, for example, a thermosetting resin, such as maleimide-modified epoxy resin, maleimide-modified phenol resin, or maleimide resin. The sealing member may be formed in gel. Such a sealing member is injected into the case 21 through a predetermined inlet formed in the case 21, and seals the substrate 14, the semiconductor element 15, the contact components 17, the bonding wires 16, and portions of the external connection terminals 18, which are disposed on the heat radiating plate 20.

Next, the contact components 17 will be described with reference to FIGS. 2A and 2B.

Figure 2A:
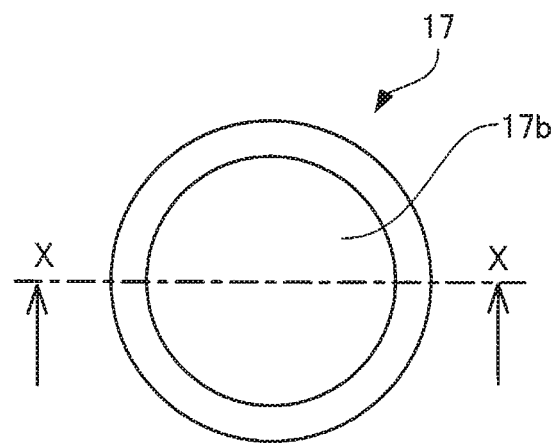
FIGS. 2A and 2B illustrate a contact component of the first embodiment.
Figure 2B:
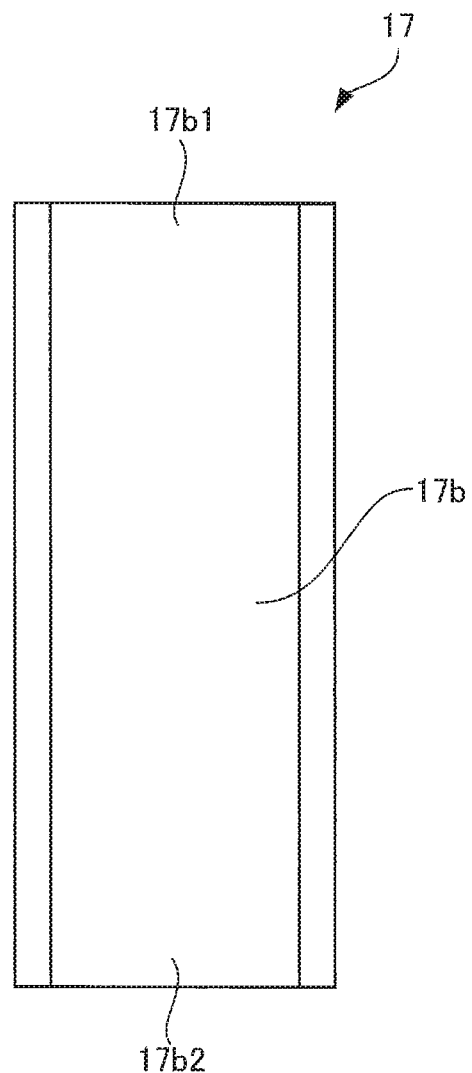

FIGS. 2A and 2B illustrate a contact component of a first embodiment. FIG. 2A is a plan view of a contact component 17. FIG. 2B is a cross-sectional view taken along an alternate long and short dashed line X-X of FIG. 2A.

The contact component 17 has a cylindrical hollow hole 17*b* formed in the contact component 17, and includes one open end portion 17*b*1 and the other open end portion 17*b*2.

A portion of the contact component 17 on the open end portion 17*b*2 side (or on the open end portion 17*b*1 side) is joined to the conductive pattern 13 by using solder. The external connection terminal 18 is press-fitted into the open end portion 17*b*1 (or the open end portion 17*b*2) which is opposite to the open end portion 17*b*2 (or the open end portion 17*b*1) joined to the conductive pattern 13.

In the contact component 17 having such a structure, the inside diameter of the hollow hole 17*b* at the open end portions 17*b*1 and 17*b*2 is preferably 0.20 mm or more and 2.00 mm or less, and more preferably, 0.50 mm or more and 1.50 mm or less. The outside diameter of the contact component 17 at the open end portions 17*b*1 and 17*b*2 is preferably 1.00 mm or more and 2.50 mm or less, and more preferably, 1.50 mm or more and 2.00 mm or less.

Next, a joint portion of the contact component 17 to the conductive pattern 13 of the substrate 14 will be described with reference to FIG. 3.

Figure 3:
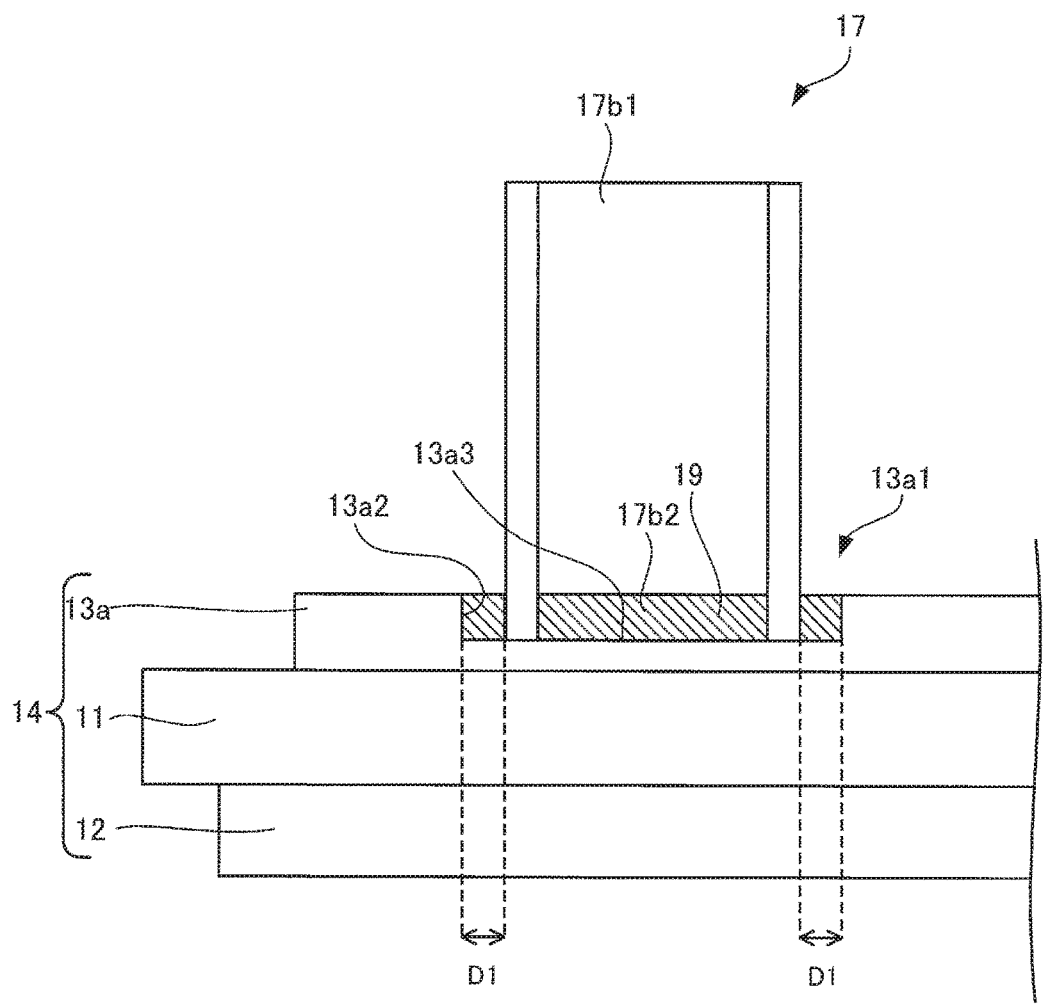
FIG. 3 is a side cross-sectional view of a joint portion of a contact component of the semiconductor device of the first embodiment.

FIG. 3 is a side cross-sectional view of a joint portion of a contact component of the semiconductor device of the first embodiment. FIG. 3 illustrates a portion of the substrate 14 where the conductive pattern 13*a* is formed. Here, a below-described joint space 13*a*1 formed in the conductive pattern 13*a* is also formed in other conductive patterns 13. The substrate 14 includes the insulation plate 11, the metal plate 12 formed on the back surface of the insulation plate 11, and the conductive pattern 13*a* formed on the front surface of the insulation plate 11.

The conductive pattern 13*a* is formed such that the joint space 13*a*1, in which the contact component 17 is to be disposed, is formed to have a concave shape, or to be recessed or indented in the conductive pattern 13*a*. The joint space 13*a*1 is formed by etching a predetermined joint area of the conductive pattern 13, which is defined for the contact component 17. The joint space 13*a*1 includes a bottom portion 13*a*3 perpendicular to the stacking direction of the substrate 14, and an inner wall portion 13*a*2 formed along the outer periphery of the bottom portion 13*a*3 and extending perpendicular to the bottom portion 13*a*3.

The thickness of the conductive pattern 13*a* is preferably 0.10 mm or more and 1.00 mm or less, and more preferably, 0.20 mm or more and 0.50 mm or less. The height of the inner wall portion 13*a*2 is preferably 0.10 mm or more and 0.8 times or less of the thickness of the conductive pattern 13*a*, and more preferably, 0.12 mm or more and 0.5 times or less of the thickness of the conductive pattern 13*a*. The width of the joint space 13*a*1 is preferably 1.05 times or more of the outside diameter of the open end portion 17*b*2 of the contact component 17, and 1.50 times or less of the outside diameter of the open end portion 17*b*2 of the contact component 17; and more preferably, 1.1 times or more of the outside diameter of the open end portion 17*b*2 of the contact component 17, and 1.25 times or less of the outside diameter of the open end portion 17*b*2 of the contact component 17. When the contact component 17 is disposed in a center portion of the joint space 13*a*1 having the above-described diameter, there is obtained an appropriate joint distance D1 from the outer periphery of the open end portion 17*b*2 of the contact component 17 to the inner wall portion 13*a*2.

In the joint space 13*a*1 of the conductive pattern 13, a solder 19 (joining member) is disposed. The solder 19 may be a lead-free, tin based solder. The portion of the contact component 17 on the open end portion 17*b*2 side is disposed in the joint space 13*a*1, in which the melted solder 19 is disposed, and then the contact component 17 is pressed downward in FIG. 3. While solder is described as the joining member in the present embodiment, embodiments of the invention encompass any type of joining member or material, such as any type of conductive paste, adhesive paste, or any other combination of adhesive or conductive paste or material capable of joining two solid materials together.

Here, the contact component 17 is disposed in the concave joint space 13a1 formed in the conductive pattern 13a. As a result, the melted solder 19 stays in the joint space 13a1 and does not spread over and wet the substrate 14 (conductive pattern 13a), so that the amount of the solder 19 in the joint space 13a1 is kept.

After the contact component 17 is disposed in the concave joint space 13a1 in this manner, when the solder 19 solidifies, the solder thickness of the solder 19 in the joint space 13a1 is kept. Thus, a lower end portion of the inner wall of the hollow hole 17b of the contact component 17, which is on the open end portion 17b2 side, joins with the solder 19. Furthermore, a lower end portion of the outer wall of the contact component 17, which is on the open end portion 17b2 side, joins with the solder 19.

Thus, a contact area between the contact component 17 and the solder 19 is kept, and the solder thickness of the solder 19 that joins the contact component 17 and the conductive pattern 13a is kept. As a result, sufficient joining strength is obtained between the contact component 17 and the conductive pattern 13a (joint space 13a1). Therefore, reduction in reliability of the semiconductor device 10 is prevented.

In addition, since an appropriate amount of the solder 19 is kept in the joint space 13a1, an extra amount of solder 19 does not need to be applied in advance. As a result, there is prevented creeping up of the solder 19 into the hollow hole 17b of the contact component 17, caused by the heat applied when the contact component 17 is joined to the conductive pattern 13a.

Next, a shape in a plan view, of the concave joint space 13a1 formed in the conductive pattern 13a will be described with reference to FIGS. 4A and 4B.

Figure 4A:
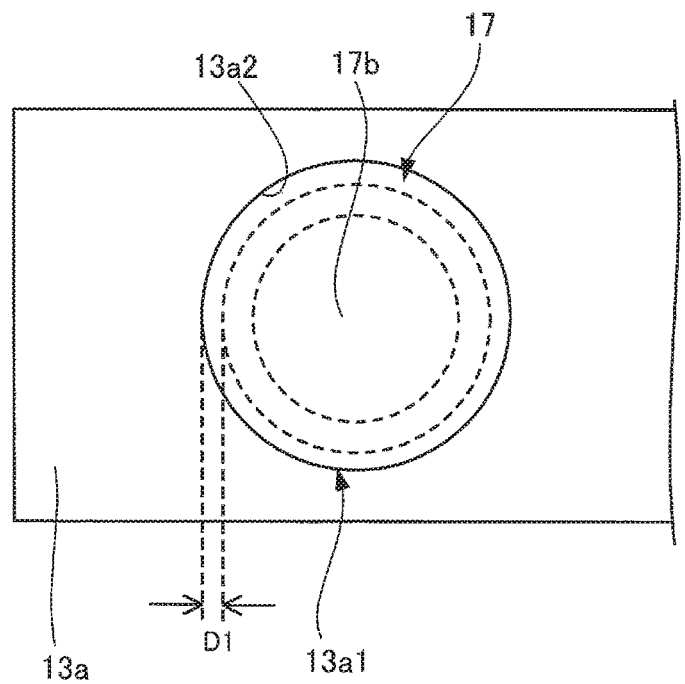
FIGS. 4A and 4B are plan views of joint spaces formed in a conductive pattern of the semiconductor device of the first embodiment.
Figure 4B:
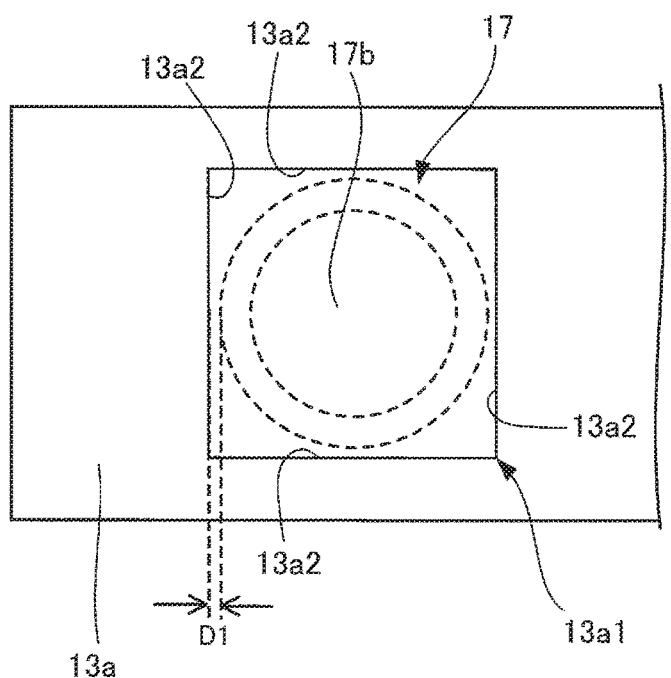

FIGS. 4A and 4B are plan views of joint spaces formed in the conductive pattern of the semiconductor device of the first embodiment.

As illustrated in FIG. 4A, the shape in a plan view, of the joint space 13a1 formed in the conductive pattern 13a may be a circle which corresponds to the ring-shaped open end portion 17b2 (see FIGS. 2A and 2B) of the contact component 17. In this case, the contact component 17 is disposed in a center portion of the joint space 13a1, and the distance from the outer periphery of the open end portion 17b2 of the contact component 17 to the inner wall portion 13a2 is desirably the joint distance D1 as is in FIG. 3.

As illustrated in FIG. 4B, the shape in a plan view, of the joint space 13a1 formed in the conductive pattern 13a may be a square which accommodates the outer periphery of the open end portion 17b2 (see FIGS. 2A and 2B) of the contact component 17. Also in this case, similarly to FIG. 4A, the contact component 17 is disposed in a center portion of the joint space 13a1, and the distance from the outer periphery of the open end portion 17b2 of the contact component 17 to the inner wall portion 13a2 is desirably the joint distance D1 as is in FIG. 3.

FIGS. 4A and 4B illustrate the shape of the joint space 13a1 in a plan view, which is a circle or a square. But the shape is not limited to those. For example, the shape of the joint space 13a1 in a plan view may be an ellipse, a rectangle, or a polygon.

Next, a method of applying solder to the conductive pattern 13a of the substrate 14 will be described.

As illustrated in FIG. 1, since the semiconductor element 15 and the contact components 17 are joined to the conductive patterns 13a, 13d, 13e, and 13f in the semiconductor device 10, corresponding solders are applied to the conductive patterns 13a, 13d, 13e, and 13f.

In the semiconductor device 10, screen printing may be used to apply the solders, which join the semiconductor element 15 and the contact components 17 to the conductive patterns. Hereinafter, the method of applying the solders to the conductive patterns 13a and 13e of the semiconductor device 10, which is performed by using screen printing, will be described with reference to FIGS. 5A to 5D.

FIGS. 5A to 5D illustrate a method of applying the solders in the semiconductor device of the first embodiment. In FIGS. 5A to 5D, the method is illustrated in time sequence, in a case where one solder is applied to join one of the contact components 17 to the conductive pattern 13a of the substrate 14, and another solder is applied to join one of the semiconductor elements 15 to the conductive pattern 13e of the substrate 14.

In FIGS. 5A to 5D, among the conductive patterns 13, there are illustrated the conductive pattern 13a in which the joint space 13a1 is formed and the conductive pattern 13e which includes a joint space 15a for the semiconductor element 15; and other conductive patterns 13b, 13c, 13d, and 13f are omitted in the figures.

Figure 5A:
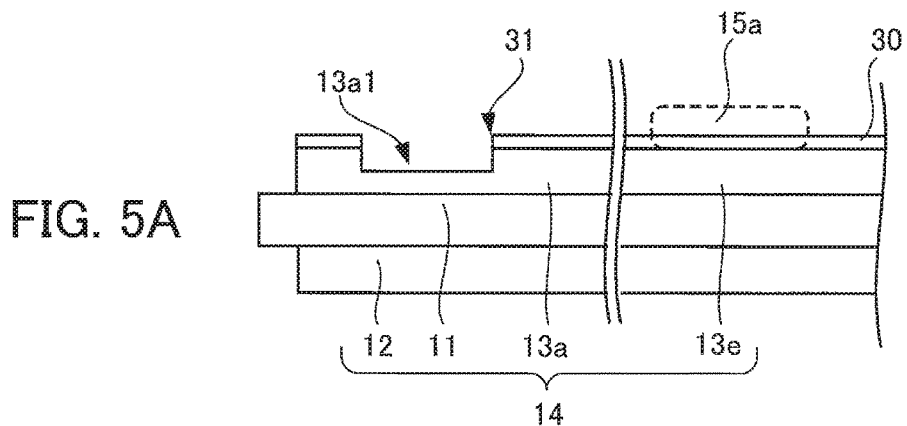
FIGS. 5A to 5D illustrate a method of applying solder in the semiconductor device of the first embodiment.

First, the joint space 13a1 is formed in advance by etching, in a joint area for the contact component 17, which is defined in the conductive pattern 13a of the substrate 14. Then, as illustrated in FIG. 5A, a first mask 30 is set on the conductive patterns 13 including the conductive pattern 13a, in which the concave joint space 13a1 is formed. The first mask 30, which is set on the substrate 14, is provided with an opening 31 corresponding to the joint space 13a1. In this time, the joint space 15a for the semiconductor element 15, which is disposed on the conductive pattern 13e, is covered with the first mask 30.

Figure 5B:
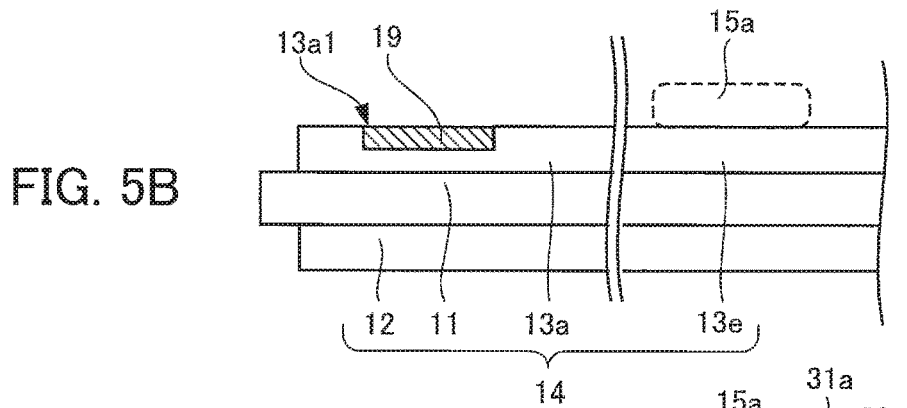

Then, a solder material is placed on the first mask 30, and is forced to slide along the first mask 30 by a squeegee. Then, the joint space 13a1, which corresponds to the opening 31 of the first mask 30, is filled with the solder material. When the first mask 30 is removed from the substrate 14, the solder 19 has been applied to the joint space 13a1 of the conductive pattern 13a, as illustrated in FIG. 5B.

Figure 5C:
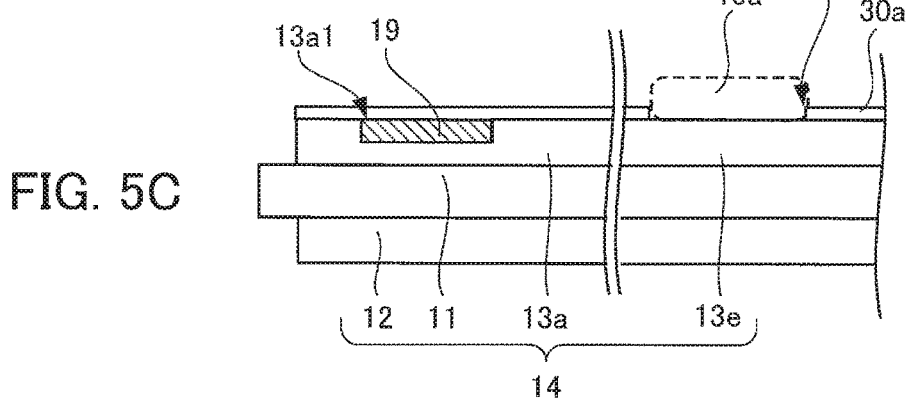

Then, as illustrated in FIG. 5C, a second mask 30a is set on the conductive patterns 13 including the conductive pattern 13a, in which the solder 19 has been applied to the concave joint space 13a1. The second mask 30a, which is set on the conductive patterns 13 of the substrate 14, is provided with an opening 31a corresponding to the joint space 15a for the semiconductor element 15. In this time, the joint space 13a1 of the conductive pattern 13a, to which the solder 19 has been applied, is covered with the second mask 30a.

Figure 5D:
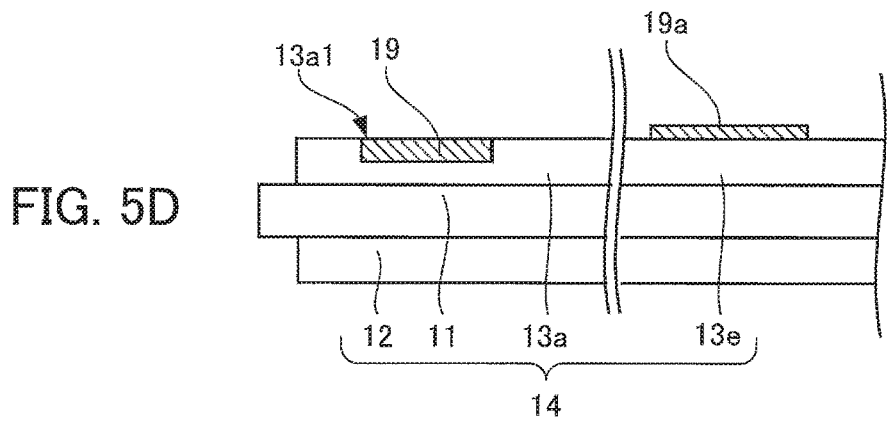

Then, a solder material is placed on the second mask 30a, and is forced to slide along the second mask 30a by a squeegee. Then, the joint space 15a, which corresponds to the opening 31a of the second mask 30a, is filled with the solder material. When the second mask 30a is removed from the substrate 14, a solder 19a has been applied to the joint space 15a for the semiconductor element 15, formed on the conductive pattern 13e, as illustrated in FIG. 5D.

By using the above-described application method, the solder 19a for joining the semiconductor element 15 and the solder 19 for joining the contact component 17 are applied to the conductive patterns 13e and 13a, respectively.

Next, another method of applying the solders to the conductive patterns 13 of the semiconductor device 10 by using screen printing will be described with reference to FIGS. 6A and 6B.

Figure 6A:
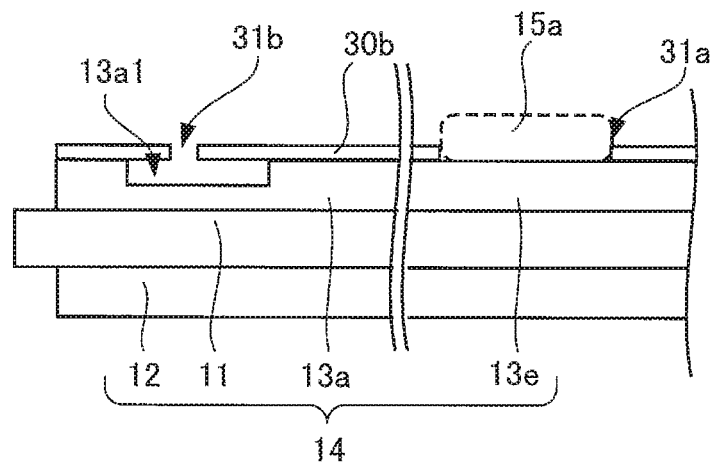
FIGS. 6A and 6B illustrate another method of applying solder in the semiconductor device of the first embodiment.
Figure 6B:
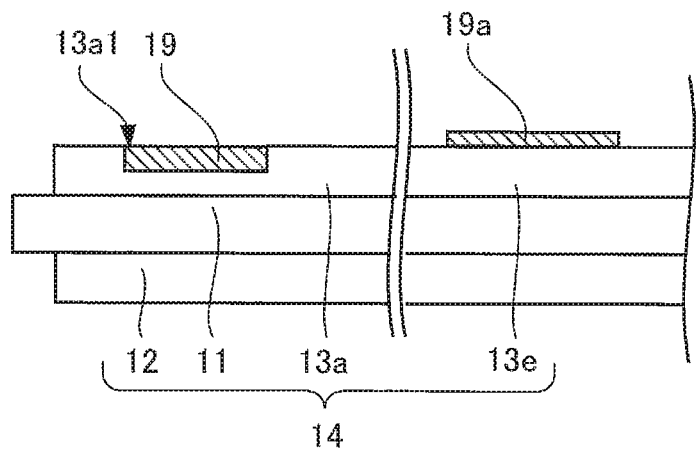

FIGS. 6A and 6B illustrate another method of applying the solders in the semiconductor device of the first embodiment.

Also in FIGS. 6A and 6B, among the conductive patterns 13, there are illustrated the conductive pattern 13a in which the joint space 13a1 is formed and the conductive pattern 13e which includes the joint space 15a for the semiconductor element 15; and other conductive patterns 13b, 13c, 13d, and 13f are omitted in the figures.

Also in this case, similarly to the above description, the joint space 13a1 is formed in advance by etching, in a joint area for the contact component 17, which is defined in the conductive pattern 13a of the substrate 14. Then, as illustrated in FIG. 6A, a third mask 30b is set on the conductive patterns 13, in which the concave joint space 13a1 is formed. The third mask 30b, which is set on the substrate 14, is provided with an opening 31b corresponding to the joint space 13a1, and with the opening 31a corresponding to the joint space 15a for the semiconductor element 15. In this case, the opening area of the opening 31b is smaller than the opening area of the joint space 13a1.

Then, a solder material is placed on the third mask 30b, and is forced to slide along the third mask 30b by a squeegee. Then, the joint space 15a for semiconductor element 15, which corresponds to the opening 31a of the third mask 30b, is filled with the solder material. Also, the joint space 13a1, which corresponds to the opening 31b of the third mask 30b, is filled with the solder material. In this time, since the opening area of the opening 31b is smaller than the opening area of the joint space 13a1, the amount of the solder material which is put into the joint space 13a1 by the squeegee is limited. With this limitation, excessive filling of the solder material into the joint space 13a1 is prevented.

Thus, when the third mask 30b is removed from the substrate 14, the solder 19 has been applied to the joint space 13a1 of the conductive pattern 13a, and the solder 19a has been applied to the joint space 15a for the semiconductor element 15, as illustrated in FIG. 6B.

By using the above-described application method, the solder 19a for joining the semiconductor element 15, and the solder 19 for joining the contact component 17 are applied to the conductive patterns 13e and 13a, respectively. Compared to the application method illustrated in FIGS. 5A to 5D, the application method illustrated in FIGS. 6A and 6B eliminates the need of replacing a mask, and thus reduces the troublesome work and production cost of the semiconductor device.

Second Embodiment

Next, another embodiment of the contact component 17 will be described with reference to FIGS. 7A and 7B.

Figure 7A:
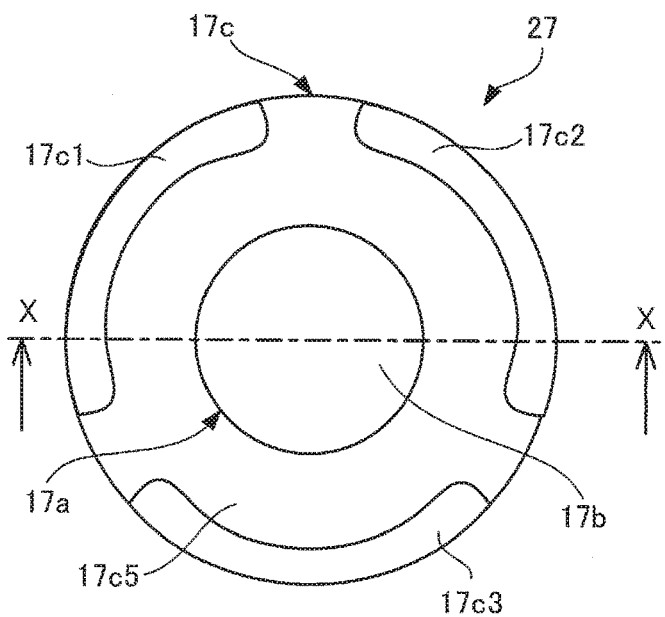
FIGS. 7A and 7B illustrate a contact component of a second embodiment.
Figure 7B:
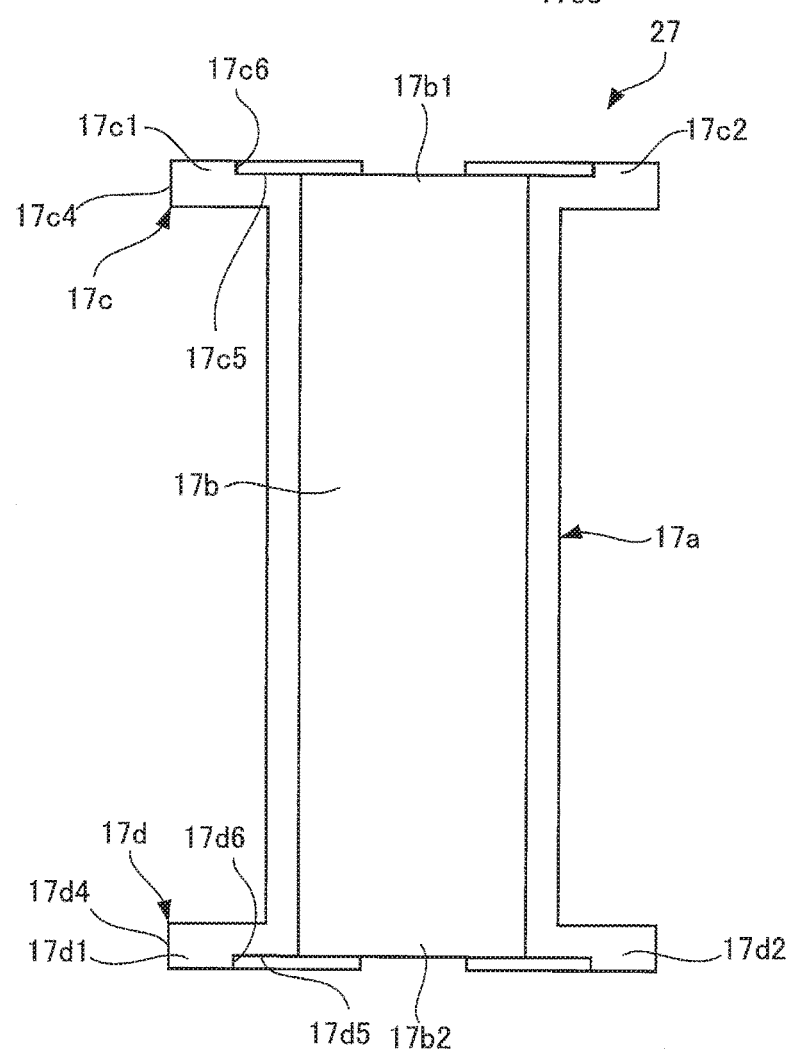

FIGS. 7A and 7B illustrate a contact component of a second embodiment. FIG. 7A is a plan view of a contact component 27. FIG. 7B is a cross-sectional view taken along an alternate long and short dashed line X-X of FIG. 7A.

The contact component 27 includes a body portion 17a, a flange 17c formed at the open end portion 17b1 of the body portion 17a, and a flange 17d formed at the open end portion 17b2 of the body portion 17a. A portion of the contact component 27 on the flange 17d side (or on the flange 17c side) is joined to the conductive pattern 13 by using the solder 19. The external connection terminal 18 is press-fitted into a portion of the contact component 27 on the flange 17c side (or on the flange 17d side) which is opposite to the open end portion joined to the conductive pattern. Here, the flanges 17c and 17d are formed at both two open end portions 17b1 and 17b2, respectively, as an example. But a flange may be formed at only one of the open end portions.

The body portion 17a is formed like a cylinder in which the hollow hole 17b is formed. The hollow hole 17b passes through a portion between the open end portions 17b1 and 17b2. The flange 17c is formed like a ring, and is provided with convex portions 17c1, 17c2, and 17c3 at three portions of the outer periphery portion of the flange 17c. In the flange 17c, the thickness of the convex portions 17c1, 17c2, and 17c3 is larger than the thickness of a bottom portion 17c5 of the flange 17c. In terms of the thickness of a side edge surface 17c4 along the outer periphery of the flange 17c, the thickness of the side edge surface 17c4 of the convex portions 17c1, 17c2, and 17c3 is larger than the thickness of the side edge surface 17c4 of the bottom portion 17c5. In addition, step portions 17c6 are formed in steps between the convex portions 17c1, 17c2, and 17c3, and the bottom portion 17c5. The height of the step portions 17c6 is a difference between the thickness of the convex portions 17c1, 17c2, and 17c3 and the thickness of the bottom portion 17c5.

The flange 17d has the same structure as the flange 17c. That is, the flange 17d is formed like a ring, and is provided with convex portions (among the convex portions, convex portions 17d1 and 17d2 are illustrated) at three portions of the outer periphery portion of the flange 17d. In the flange 17d in which the convex portions 17d1 and 17d2 are formed, the thickness of the convex portions 17d1 and 17d2 is larger than the thickness of a bottom portion 17d5 of the flange 17d. Thus, in terms of the thickness of a side edge surface 17d4 along the outer periphery of the flange 17d, the thickness of the side edge surface 17d4 of the convex portions 17d1 and 17d2 is larger than the thickness of the side edge surface 17d4 of the bottom portion 17d5. In addition, step portions 17d6 are formed in steps between the convex portions 17d1 and 17d2 and the bottom portion 17d5. The height of the step portions 17d6 is a difference between the thickness of the convex portions 17d1 and 17d2 and the thickness of the bottom portion 17d5. The height of the step portions 17d6 is preferably 0.01 mm or more and 0.2 mm or less.

With the convex portions 17c1, 17c2, 17c3, 17d1, and 17d2 formed in the outer periphery portions of the flanges 17c and 17d, the flanges 17c and 17d ensure a predetermined thickness of the solder 19, which joins the contact component 27 and the conductive pattern 13. This keeps a higher joining strength between the conductive pattern 13 and the contact component 27.

In the contact component 27 having such a structure, the inside diameter of the body portion 17a is preferably 0.2 mm or more and 2.00 mm or less, and more preferably, 0.5 mm or more and 1.5 mm or less. The thickness of the convex portions 17c1, 17c2, 17c3, 17d1, and 17d2 of the flanges 17c and 17d is preferably 0.05 mm or more and 0.3 mm or less, and more preferably, 0.1 mm or more and 0.2 mm or less.

Next, a joint portion of the contact component 27 to the conductive pattern 13 of the substrate 14 will be described with reference to FIG. 8.

Figure 8:
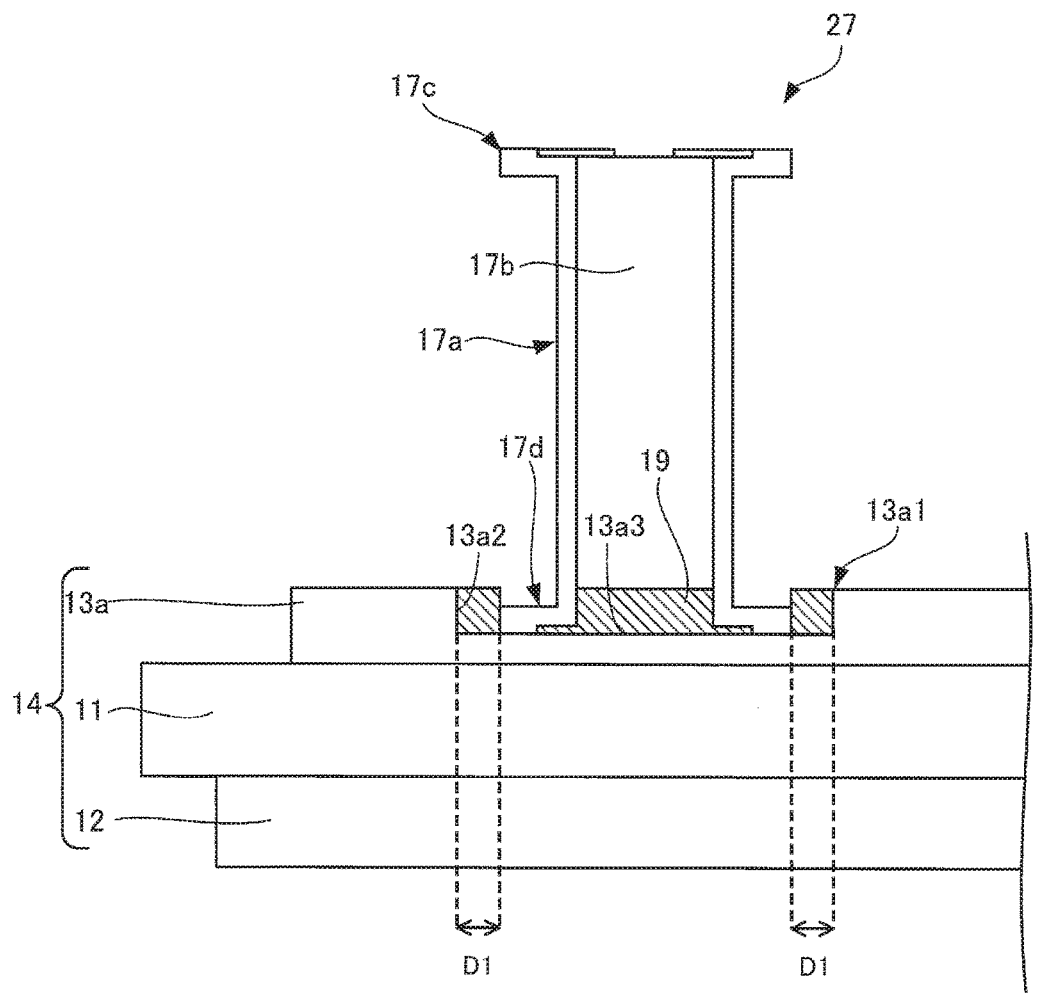
FIG. 8 is a side cross-sectional view of a joint portion of a contact component of a semiconductor device of the second embodiment.

FIG. 8 is a side cross-sectional view of a joint portion of a contact component of a semiconductor device of the second embodiment. Similarly to FIG. 3 of the first embodiment, FIG. 8 illustrates a portion of the substrate 14 where the conductive pattern 13a is formed. In the second embodiment, the concave joint space 13a1 formed in the conductive pattern 13a of the substrate 14 of the semiconductor device 10 of the first embodiment is illustrated with a relationship with the flange 17d of the contact component 27. In the flange 17d, at least the bottom portion 17d5, step portions 17d6, and side edge surface 17d4 (see FIG. 7B) each have a joint region for joining with the solder 19. In addition, the bottom portion of the convex portion 17d1 may have a joint region for joining with the solder 19. The entire surface of the bottom portion 17d5 and step portions 17d6 may be used as a joint region for joining with the solder 19. Alternatively, a partial surface of each of the bottom portion 17d5, step portions 17d6, and side edge surface 17d4 may be used as a joint region.

The thickness of the conductive pattern 13a is preferably 0.1 mm or more and 1.0 mm or less, and more preferably, 0.2 mm or more and 0.5 mm or less. The height of the inner wall portion 13a2 is preferably equal to or lower than 0.8 times the thickness of the conductive pattern 13a; and more preferably, equal to or lower than 0.5 times the thickness of the conductive pattern 13a. The height of the inner wall portion 13a2 does not exceed 0.8 times the thickness of the conductive pattern 13a; preferably, is equal to or larger than 0.5 times the height of the step portions 17d6 of the flange 17d (see FIG. 7B); and more preferably, is equal to or larger than 1.0 times the height of the step portions 17d6. Alternatively, the height of the inner wall portion 13a2 does not exceed 0.8 times the thickness of the conductive pattern 13a; preferably, is equal to or larger than 0.2 times the thickness of the convex portions 17d1 and 17d2 of the flange 17d (see FIG. 7B); and more preferably, is equal to or larger than 1.0 times the thickness of the convex portions 17d1 and 17d2. The width of the joint space 13a1 is preferably equal to or larger than 1.05 times the outside diameter of the flange 17d, and equal to or smaller than 1.5 times the outside diameter of the flange 17d; and more preferably, equal to or larger than 1.1 times the outside diameter of the flange 17d, and equal to or smaller than 1.25 times the outside diameter of the flange 17d. When the contact component 27 is disposed in a center portion of the joint space 13a1 having the above-described diameter, there is obtained an appropriate joint distance D1 from the side edge surface 17d4 (see FIG. 7B) of the flange 17d of the contact component 27 to the inner wall portion 13a2.

In the joint space 13a1 of the conductive pattern 13, the solder 19 is disposed as a joining member. The solder 19 may be a lead-free, tin based solder. The portion of the contact component 27 on the flange 17d side is disposed in the joint space 13a1, where the melted solder 19 is disposed; then the contact component 27 is pressed downward in FIG. 8.

Here, since the contact component 27 is disposed in the concave joint space 13a1 formed in the conductive pattern 13a, the melted solder 19 stays in the joint space 13a1 and does not spread over and wet the substrate 14 (conductive pattern 13a), so that the amount of the solder 19 in the joint space 13a1 is kept.

After the contact component 27 is disposed in the concave joint space 13a1 in this manner, when the solder 19 solidifies, the solder thickness of the solder 19 in the joint space 13a1 is kept. Thus, a lower end portion of the inner wall of the hollow hole 17b of the contact component 27, which is on the flange 17d side, joins with the solder 19. Furthermore, the side edge surface 17d4 of the contact component 27, which is on the flange 17d side, joins with the solder 19.

Thus, a contact area between the contact component 27 and the solder 19 is kept, and the solder thickness of the solder 19 that joins the contact component 27 and the conductive pattern 13a is kept. As a result, sufficient joining strength is obtained between the contact component 27 and the conductive pattern 13a (joint space 13a1). Therefore, reduction in reliability of the semiconductor device 10 is prevented.

In addition, since an appropriate amount of the solder 19 is kept in the joint space 13a1, an extra amount of solder 19 does not need to be applied in advance. As a result, there is prevented creeping up of the solder 19 into the hollow hole 17b of the contact component 27, caused by the heat applied when the contact component 27 is joined to the conductive pattern 13.

Third Embodiment

Figure 9:
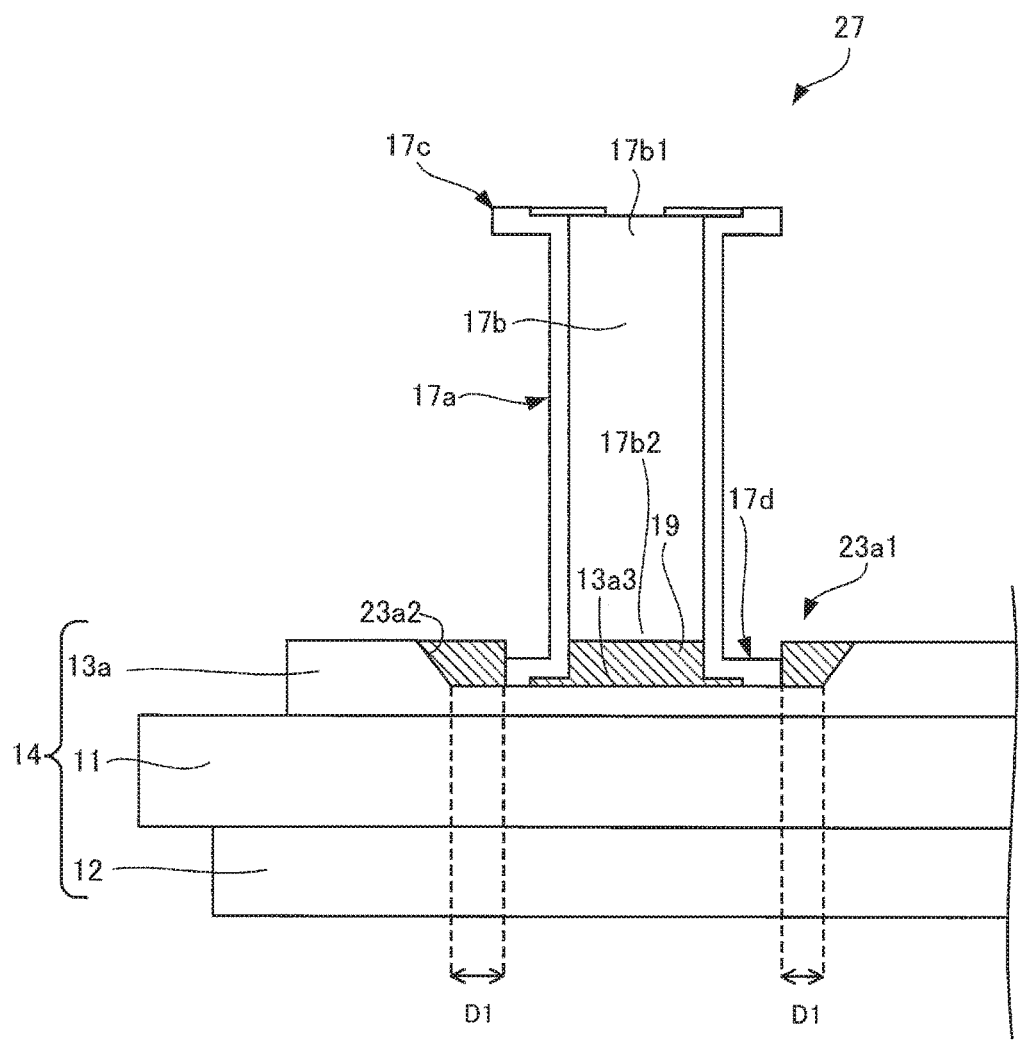
FIG. 9 is a side cross-sectional view of a joint portion of a contact component of a semiconductor device of a third embodiment.

In a third embodiment, the concave joint space formed in the conductive pattern 13a of the substrate 14 of the semiconductor device 10 of the second embodiment is widened toward the opening of the concave joint space, as illustrated in FIG. 9.

FIG. 9 is a side cross-sectional view of a joint portion of a contact component of a semiconductor device of the third embodiment.

In a joint space 23a1 of the third embodiment, an inner wall portion 23a2 is inclined with respect to the bottom portion 13a3 at an angle larger than a right angle (or at an obtuse angle). Here, the below-described joint space 23a1 formed in the conductive pattern 13a is also formed in other conductive patterns 13.

Similarly to FIG. 8, since the contact component 27 is disposed in the concave joint space 23a1 formed in the conductive pattern 13a, the melted solder 19 stays in the joint space 23a1 and does not spread over and wet the substrate 14 (conductive pattern 13a), so that the amount of the solder 19 in the joint space 23a1 is kept.

After the contact component 27 is disposed in the concave joint space 23a1, when the solder 19 solidifies, the solder thickness of the solder 19 in the joint space 23a1 is kept. As a result, the bottom portion 17d5 and the step portions 17d6 (see FIG. 7B) of the flange 17d of the contact component 27 join with the solder 19. In addition, a lower end portion of the inner wall of the hollow hole 17b of the body portion 17a of the contact component 27 joins with the solder 19. Furthermore, the side edge surface 17d4 (see FIG. 7B) of the flange 17d of the contact component 27 joins with the solder 19.

Thus, a contact area between the contact component 27 and the solder 19 is kept, and the solder thickness of the solder 19 that joins the contact component 27 and the conductive pattern 13a is kept. As a result, sufficient joining strength is obtained between the contact component 27 and the conductive pattern 13a (joint space 23a1). Therefore, reduction in reliability of the semiconductor device 10 is prevented. In addition, since an appropriate amount of the solder 19 is kept in the joint space 23a1, an extra amount of solder 19 does not need to be applied in advance. As a result, there is prevented creeping up of the solder 19 into the hollow hole 17b of the contact component 27, caused by the heat applied when the contact component 27 is joined to the conductive pattern 13a.

In the case of the joint space 23a1 illustrated in FIG. 9, since the inner wall portion 23a2 is inclined with respect to the bottom portion 13a3 at an obtuse angle, the contact component 27 is easily fitted into the joint space 23a1. With this structure, the mounting work of the contact component 27 to the joint space 23a1 becomes easier, which reduces troublesomeness of the mounting work and production cost of the semiconductor device 10.

In the third embodiment, the description has been made for the configuration that uses the contact component 27 in which the flanges 17c and 17d of FIGS. 7A and 7B are formed. However, another configuration which uses the contact component 17 illustrated in FIGS. 2A and 2B also produces the similar effects.

Fourth Embodiment

In a fourth embodiment, the description will be made for a case where a convex portion (protruding portion) is formed on a center portion of the joint space 13a1 of the conductive pattern 13a of the semiconductor device 10 of the first embodiment. Here, a below-described joint space 33a1 formed in the conductive pattern 13a is also formed in other conductive patterns 13.

The fourth embodiment also uses the semiconductor device 10 and the contact component 27, illustrated in FIGS. 1, 7A, and 7B, except for the joint space of the conductive pattern 13a. Thus, the detailed description of the semiconductor device 10 and the contact component 27 will be omitted.

Next, a joint portion of the contact component 27 to the conductive pattern 13a of the substrate 14 will be described with reference to FIG. 10.

Figure 10:
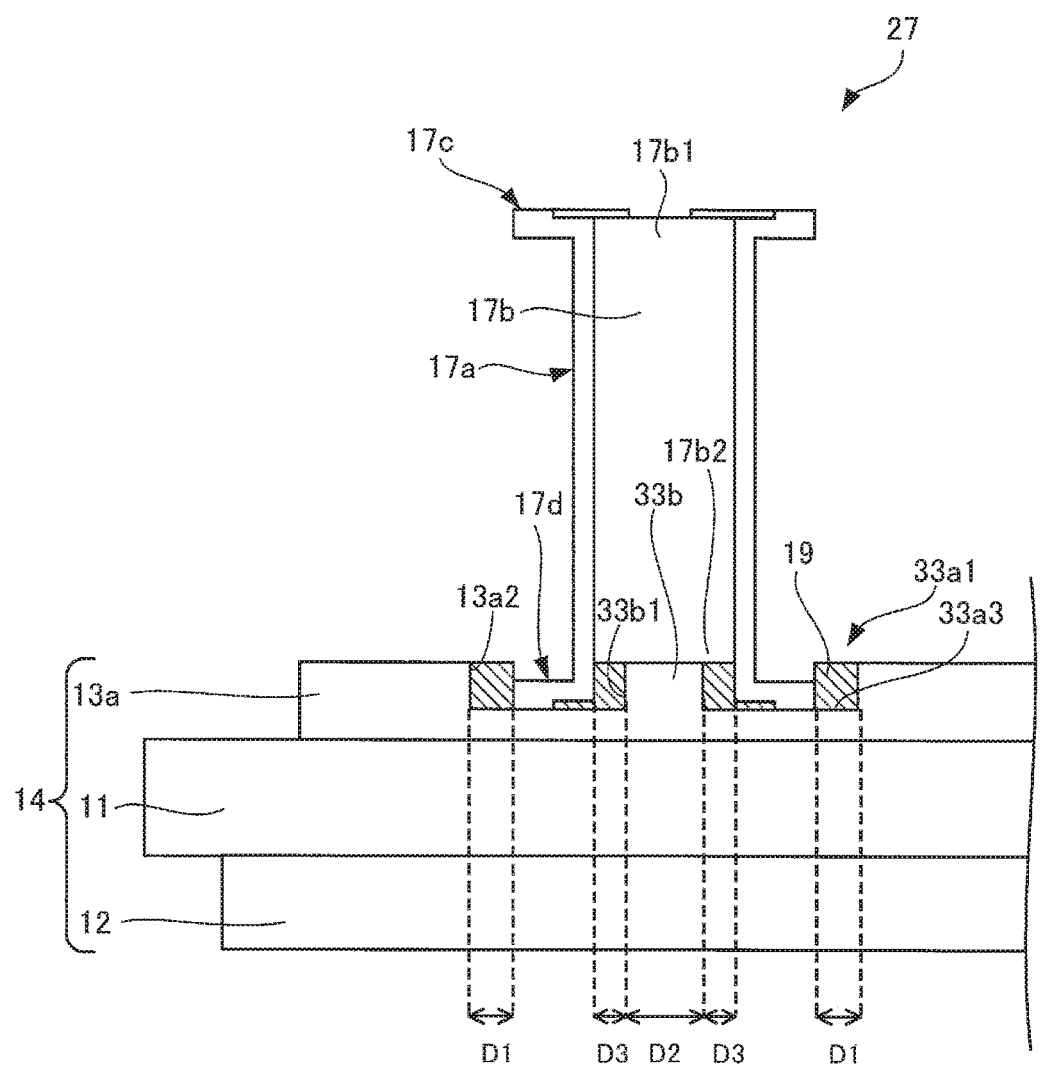
FIG. 10 is a side cross-sectional view of a joint portion of a contact component of a semiconductor device of a fourth embodiment.

FIG. 10 is a side cross-sectional view of a joint portion of a contact component of the semiconductor device of the fourth embodiment.

The joint space 33a1 is formed in the joint area of the conductive pattern 13a of the substrate 14, in which the contact component 27 is to be disposed. The joint space 33a1 is concave and formed like a ring, and has a cylindrical convex portion 33b formed on a center portion of the joint space 33a1. The joint space 33a1 is formed by etching the joint area of the conductive pattern 13a, which is defined for the contact component 27, while leaving the convex portion 33b. The joint space 33a1 includes a bottom portion 33a3 perpendicular to the stacking direction of the substrate 14 and formed circular, and an inner wall portion 13a2 extending perpendicular to the bottom portion 33a3 and formed along the outer periphery of the bottom portion 33a3. In addition, the joint space 33a1 includes a peripheral wall 33b1 of the convex portion 33b. The shape of the peripheral wall 33b1 is a circle in a plan view.

The height of the inner wall portion 13a2 is the same as that of the second embodiment. The width (diameter) of the joint space 33a1 is preferably equal to or larger than 1.05 times the outside diameter of the flange 17d, and equal to or smaller than 1.50 times the outside diameter of the flange 17d; and more preferably, equal to or larger than 1.10 times the outside diameter of the flange 17d, and equal to or smaller than 1.25 times the outside diameter of the flange 17d. When the contact component 27 is disposed in a center portion of the joint space 33a1 having the above-described diameter, there is obtained an appropriate joint distance D1 from the side edge surface 17d4 (see FIG. 7B) of the flange 17d of the contact component 27 to the inner wall portion 13a2.

A width (diameter) D2 of the convex portion 33b is preferably equal to or larger than 0.5 times the width (diameter) of the hollow hole 17b of the contact component 27, and smaller than 1.0 times the width (diameter) of the hollow hole 17b; and more preferably, equal to or larger than 0.6 times the width (diameter) of the hollow hole 17b, and equal to or smaller than 0.9 times the width (diameter) of the hollow hole 17b. With this structure, there is obtained an appropriate distance D3 from the peripheral wall 33b1 of the convex portion 33b to the inner wall of the hollow hole 17b of the contact component 27, which the convex portion 33b enters.

The shape of the inner wall portion 13a2 of the joint space 33a1 in a plan view may be a circle, as illustrated in FIG. 4A, which corresponds to the shape of the ring-shaped flange 17d of the contact component 27. Alternatively, the shape may be a square, as illustrated in FIG. 4B, which accommodates the ring-shaped flange 17d of the contact component 27.

In the joint space 33a1 of the conductive pattern 13a, the solder 19 is disposed. A portion of the contact component 27 on the flange 17d side is disposed in the joint space 33a1, where the melted solder 19 is disposed. In this time, the convex portion 33b formed on the joint space 33a1 allows the contact component 27 to be properly positioned with respect to the joint space 33a1. Then the contact component 27 is pressed downward in FIG. 10, with the convex portion 33b being fitted into the open end portion 17b2 of the hollow hole 17b of the body portion 17a of the contact component 27.

Here, since the contact component 27 is disposed in the joint space 33a1 formed in the conductive pattern 13a, the melted solder 19 stays in the joint space 33a1 and does not spread over and wet the substrate 14 (conductive pattern 13a), so that the amount of the solder 19 in the joint space 33a1 is kept.

After the contact component 27 is disposed in the joint space 33a1 in this manner, when the solder 19 solidifies, the solder thickness of the solder 19 in the joint space 33a1 is kept. As a result, the bottom portion 17d5 and the step portions 17d6 (see FIG. 7B) of the flange 17d of the contact component 27 join with the solder 19. In addition, a lower end portion of the inner wall of the hollow hole 17b of the body portion 17a of the contact component 27 joins with the solder 19. Furthermore, the side edge surface 17d4 (see FIG. 7B) of the flange 17d of the contact component 27 joins with the solder 19.

In addition, since the convex portion 33b enters the open end portion 17b2 of the hollow hole 17b of the contact component 27, the amount of the solder 19 which enters the open end portion 17b2 of the hollow hole 17b of the contact component 27 is limited, compared to the amount of the solder 19 in the first and the second embodiments. For example, even when a vacuum is produced in the hollow hole 17b of the contact component 27 to remove voids of the solder 19, the amount of the solder 19 which creeps up toward the open end portion 17b1 of the hollow hole 17b is reduced, because the convex portion 33b limits the amount of the solder 19 which enters the hollow hole 17b. This prevents reduction in the amount of the solder 19 of the joint space 33a1, and more reliably keeps the solder thickness of the solder 19 of the joint space 33a1.

Thus, a contact area between the contact component 27 and the solder 19 is kept, and the solder thickness of the solder 19 that joins the contact component 27 and the conductive pattern 13a is more reliably kept than the first and the second embodiments. As a result, sufficient joining strength is obtained between the contact component 27 and the conductive pattern 13a (joint space 33a1). Therefore, reduction in reliability of the semiconductor device 10 is prevented.

In addition, since an appropriate amount of the solder 19 is kept in the joint space 33a1, an extra amount of solder 19 does not need to be applied in advance. Moreover, the amount of the solder is limited by the convex portion 33b formed on the joint space 33a1. As a result, there is more effectively prevented creeping up of the solder 19 into the hollow hole 17b of the contact component 27, caused by the heat applied when the contact component 27 is joined to the conductive pattern 13a.

The creeping up of the solder 19 is more effectively prevented by increasing the height of the convex portion 33b as much as possible. However, since the external connection terminal 18 is press-fitted into a portion of the contact component 27 on the open end portion 17b1 side, the height of the convex portion 33b is preferably equal to or higher than 0.5 times the height of the inner wall portion 13a2, and equal to or lower than 2.0 times the height of the inner wall portion 13a2; and more preferably, equal to the height of the inner wall portion 13a2.

The convex portion 33b may be formed on a center portion of the joint space 23a1 (FIG. 9) of the third embodiment. Also in this case, the similar effects to those of the fourth embodiment are obtained.

In the fourth embodiment, the description has been made for the configuration that uses the contact component 27 in which the flanges 17c and 17d of FIGS. 7A and 7B are formed. However, another configuration which uses the contact component 17 illustrated in FIGS. 2A and 2B also produces the similar effects.

Fifth Embodiment

In a fifth embodiment, the description will be made for a case where the inner wall portion 13a2 of the joint space 33a1 of the conductive pattern 13a of the semiconductor device 10 of the fourth embodiment is inclined with respect to the bottom portion 33a3 at an acute angle. Here, a below-described joint space 43a1 formed in the conductive pattern 13a is also formed in other conductive patterns 13.

The fifth embodiment also uses the semiconductor device 10 and the contact component 27, illustrated in FIGS. 1, 7A, and 7B, except for the joint space of the conductive pattern 13a. Thus, the detailed description of the semiconductor device 10 and the contact component 27 will be omitted.

Next, a joint portion of the contact component 27 to the conductive pattern 13a of the substrate 14 will be described with reference to FIG. 11.

Figure 11:
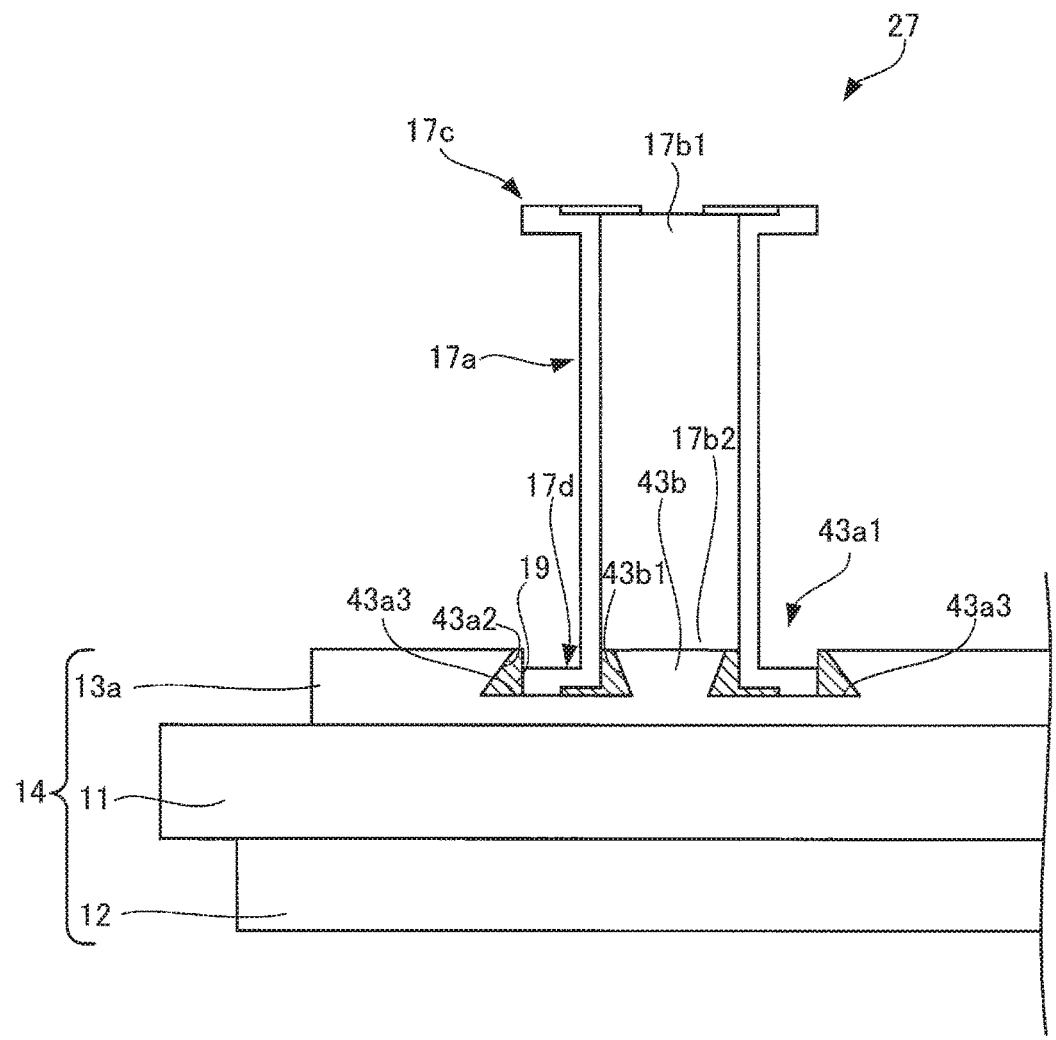
FIG. 11 is a side cross-sectional view of a joint portion of a contact component of a semiconductor device of a fifth embodiment.

FIG. 11 is a side cross-sectional view of a joint portion of a contact component of the semiconductor device of the fifth embodiment.

The joint space 43a1 is formed in the joint area of the conductive pattern 13a of the substrate 14, in which the contact component 27 is to be disposed. The joint space 43a1 is concave and formed like a ring, and has a convex portion 43b formed on a center portion of the joint space 43a1. The joint space 43a1 is formed by etching the joint area of the conductive pattern 13a, which is defined for the contact component 27, while leaving the convex portion 43b. The joint space 43a1 includes a bottom portion 43a3 perpendicular to the stacking direction of the substrate 14 and formed circular, and an inner wall portion 43a2 inclined with respect to the bottom portion 43a3 at an angle smaller than a right angle (or at an acute angle). In addition, the joint space 43a1 includes a peripheral wall 43b1 of the convex portion 43b. The peripheral wall 43b1 is also inclined with respect to the bottom portion 43a3 at an acute angle. The depth of the joint space 43a1 is equal to the height of the inner wall portion 13a2 of the second embodiment. Preferably, the widths (diameters) of the joint space 43a1 from the front surface of the conductive pattern 13a to the bottom portion 43a3 fall within the following range. Specifically, the widths (diameters) are equal to or larger than 1.05 times the outside diameter of the flange 17d and equal to or smaller than 1.5 times the outside diameter of the flange 17d; and more preferably, equal to or larger than 1.1 times the outside diameter of the flange 17d and equal to or smaller than 1.25 times the outside diameter of the flange 17d. When the contact component 27 is disposed in a center portion of the joint space 43a1 having the above-described diameters, there is obtained an appropriate joint distance from the side edge surface 17d4 (see FIG. 7B) of the flange 17d of the contact component 27 to the inner wall portion 43a2. The shape of the inner wall portion 43a2 of the joint space 43a1 in a plan view may be a circle, as illustrated in FIG. 4A, which corresponds to the shape of the ring-shaped flange 17d of the contact component 27. Alternatively, the shape may be a square, as illustrated in FIG. 4B, which accommodates the ring-shaped flange 17d of the contact component 27.

In the joint space 43a1 of the conductive pattern 13a, the solder 19 is disposed. A portion of the contact component 27 on the flange 27d side is disposed in the joint space 43a1, where the melted solder 19 is disposed. In this time, the convex portion 43b formed on the joint space 43a1 allows the contact component 27 to be properly positioned with respect to the joint space 43a1. Then the contact component 27 is pressed downward in FIG. 11, with the convex portion 43b being fitted into the open end portion 17b2 of the hollow hole 17b of the body portion 17a of the contact component 27.

Here, since the contact component 27 is disposed in the joint space 43a1 formed in the conductive pattern 13a, the melted solder 19 stays in the joint space 43a1 and does not spread over and wet the substrate 14 (conductive pattern 13a), so that the amount of the solder 19 in the joint space 43a1 is kept.

After the contact component 27 is disposed in the joint space 43a1 in this manner, when the solder 19 solidifies, the solder thickness of the solder 19 in the joint space 43a1 is kept. As a result, the bottom portion 17d5 and the step portions 17d6 (see FIG. 7B) of the flange 17d of the contact component 27 join with the solder 19. In addition, a lower end portion of the inner wall of the hollow hole 17b of the body portion 17a of the contact component 27 joins with the solder 19. Furthermore, the side edge surface 17d4 (see FIG. 7B) of the flange 17d of the contact component 27 joins with the solder 19.

In addition, since the convex portion 43b enters the open end portion 17b2 of the hollow hole 17b of the contact component 27, the amount of the solder 19 which enters the open end portion 17b2 of the hollow hole 17b of the contact component 27 is limited, compared to the amount of the solder 19 in the first and the second embodiments. As a result, the amount of the solder 19 which creeps up toward the open end portion 17b1 of the hollow hole 17b is reduced, as is in the fourth embodiment. This prevents reduction in the amount of the solder 19 of the joint space 43a1, and more reliably keeps the solder thickness of the solder 19 of the joint space 43a1. Similarly to the fourth embodiment, the creeping up of the solder 19 is prevented by increasing the height of the convex portion 43b as much as possible. However, since the external connection terminal 18 is press-fitted into a portion of the contact component 27 on the open end portion 17b1 side, the height of the convex portion 43b is preferably equal to or higher than 0.5 times the height of the inner wall portion 13a2 (see FIG. 8), and equal to or lower than 2.0 times the height of the inner wall portion 13a2; and more preferably, equal to the height of the inner wall portion 13a2 (see FIG. 8).

The inner wall portion 43a2 of the joint space 43a1 is inclined with respect to the bottom portion 43a3 at an acute angle. In addition, the peripheral wall 43b1 of the convex portion 43b is also inclined with respect to the bottom portion 43a3 at an acute angle. As a result, the solder 19 between the inner wall portion 43a2 and the bottom portion 43a3 is formed tapered, and the solder 19 between the peripheral wall 43b1 and the bottom portion 43a3 is also formed tapered. With this structure, there are increased solder thicknesses between the inner wall portion 43a2 and the flange 17d of the contact component 27 and between the peripheral wall 43b1 and the flange 17d of the contact component 27, and thus the joining strength between the contact component 27 and the conductive pattern 13a increases.

Thus, the solder thickness of the solder 19 that joins the contact component 27 and the conductive pattern 13a is more reliably kept than the first and the second embodiments, and thus the more reliable joining strength is obtained between the contact component 27 and the conductive pattern 13a (joint space 43a1). Therefore, reduction in reliability of the semiconductor device 10 is prevented.

In addition, since an appropriate amount of the solder 19 is kept in the joint space 43a1, an extra amount of solder 19 does not need to be applied in advance. As a result, there is prevented creeping up of the solder 19 into the hollow hole 17b of the contact component 27, caused by the heat applied when the contact component 27 is joined to the conductive pattern 13a. In the fifth embodiment, the description has been made for the case where the convex portion 43b is formed on the joint space 43a1. The joint space 43a1 also increases the joining strength between the contact component 27 and the conductive pattern 13a with respect to the joining strength of the second embodiment, even if the convex portion 43b is not formed as is in the case of the joint space 13a1 (FIG. 8) of the second embodiment.

In addition, the joint space 43a1 also increases the joining strength between the contact component 27 and the conductive pattern 13a with respect to the joining strength of the fourth embodiment, even if the peripheral wall 43b1 of the convex portion 43b is perpendicular to the bottom portion 43a3.

In the fifth embodiment, the description has been made for the configuration that uses the contact component 27 in which the flanges 17c and 17d of FIGS. 7A and 7B are formed. However, another configuration which uses the contact component 17 illustrated in FIGS. 2A and 2B also produces the similar effects.

The technique of the present disclosure prevents the solder from spreading over and wetting the substrate, while preventing reduction in joining strength between the conductive pattern and the contact component. In addition, the creeping up of the solder into the hollow hole of the contact component is also prevented. Therefore, reduction in reliability of the semiconductor device is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    a substrate including an insulation plate and a conductive pattern formed on the insulation plate, the conductive pattern having a concave joint space formed therein; and
    a contact component having a cylindrical shape with a hollow hole extending through the contact component, wherein
    the contact component includes a first open end portion on one side, the first open end portion being joined to the joint space of the conductive pattern via a joining member, and
    the concave joint space is recessed toward the insulation plate.

2. The semiconductor device according to claim 1, wherein the contact component includes a body portion in which the hollow hole is formed, the body portion having the first open end portion on the one side and a second open end portion on an opposite side, and the contact component further including a flange formed at the first open end portion on the one side, and
    wherein the first open end portion of the contact component on the one side, and the flange, are joined to the conductive pattern in the joint space via the joining member.

3. The semiconductor device according to claim 2, wherein the joint space includes a bottom portion perpendicular to a stacking direction of the substrate, and an inner wall portion perpendicular to the bottom portion and formed along an outer periphery of the bottom portion.

4. The semiconductor device according to claim 2, wherein the joint space includes a bottom portion perpendicular to a stacking direction of the substrate, and an inner wall portion inclined with respect to the bottom portion at an obtuse angle and formed along an outer periphery of the bottom portion.

5. The semiconductor device according to claim 2, wherein the joint space includes a bottom portion perpendicular to a stacking direction of the substrate, and an inner wall portion inclined with respect to the bottom portion at an acute angle and formed along an outer periphery of the bottom portion.

6. The semiconductor device according to claim 2, wherein a protruding portion is formed on the conductive pattern, and
    wherein the protruding portion is configured to enter the hollow hole of the contact component when the contact component is joined to the conductive pattern in the joint space.

7. The semiconductor device according to claim 6, wherein an outside diameter of the protruding portion is equal to or larger than 0.5 times an inside diameter of the hollow hole of the contact component and smaller than 1.0 times the inside diameter of the hollow hole of the contact component.

8. The semiconductor device according to claim 2, wherein an inside diameter of the joint space is equal to or larger than 1.05 times an outside diameter of the open end portion of the contact component on the one side and equal to or smaller than 1.50 times the outside diameter of the first open end portion of the contact component on the one side.

9. The semiconductor device according to claim 1, wherein the joint space includes a bottom portion perpendicular to a stacking direction of the substrate, and an inner wall portion perpendicular to the bottom portion and formed along an outer periphery of the bottom portion.

10. The semiconductor device according to claim 1, wherein the joint space includes a bottom portion perpendicular to a stacking direction of the substrate, and an inner wall portion inclined with respect to the bottom portion at an obtuse angle and formed along an outer periphery of the bottom portion.

11. The semiconductor device according to claim 1, wherein the joint space includes a bottom portion perpendicular to a stacking direction of the substrate, and an inner wall portion inclined with respect to the bottom portion at an acute angle and formed along an outer periphery of the bottom portion.

12. The semiconductor device according to claim 1, wherein a protruding portion is formed on the conductive pattern, and
wherein the protruding portion is configured to enter the hollow hole of the contact component when the contact component is joined to the conductive pattern in the joint space.

13. The semiconductor device according to claim 12, wherein an outside diameter of the protruding portion is equal to or larger than 0.5 times an inside diameter of the hollow hole of the contact component and smaller than 1.0 times the inside diameter of the hollow hole of the contact component.

14. The semiconductor device according to claim 1, wherein an inside diameter of the joint space is equal to or larger than 1.05 times an outside diameter of the open end portion of the contact component on the one side and equal to or smaller than 1.50 times the outside diameter of the first open end portion of the contact component on the one side.

15. A semiconductor device comprising:
a substrate including an insulation plate and a conductive pattern formed on the insulation plate, the conductive pattern having a concave joint space formed therein; and
a contact component having a cylindrical shape with a hollow hole extending through the contact component, wherein
the contact component includes a first open end portion on one side, the first open end portion being joined to the joint space of the conductive pattern via a joining member, and
the joint space includes
a bottom parallel to a surface of the conductive pattern, disposed within the substrate, and
an inner wall formed along an outer periphery of the bottom portion, and extending from the bottom toward the surface of the substrate.

* * * * *